(12) United States Patent
Chen et al.

(10) Patent No.: US 7,598,561 B2
(45) Date of Patent: Oct. 6, 2009

(54) NOR FLASH MEMORY

(75) Inventors: Bomy Chen, Cupertino, CA (US);
Prateep Tuntasood, San Jose, CA (US);
Der-Tsyr Fan, Jhongli (TW)

(73) Assignee: Silicon Storage Technolgy, Inc.,
Sunnyvale, CA (US)

( * ) Notice: Subject to any disclaimer, the term of this patent is extended or adjusted under 35 U.S.C. 154(b) by 394 days.

(21) Appl. No.: 11/381,948

(22) Filed: May 5, 2006

(65) Prior Publication Data
US 2007/0257299 A1 Nov. 8, 2007

(51) Int. Cl.
*H01L 29/788* (2006.01)
(52) U.S. Cl. .................. 257/315; 257/314; 257/316; 257/E29.129; 257/E29.3; 257/E21.179; 438/201; 438/211
(58) Field of Classification Search ................. 257/315, 257/314–326, E29.129, E29.3, E21.179, 257/E21.68; 438/201, 211
See application file for complete search history.

(56) References Cited

U.S. PATENT DOCUMENTS

| | | | |
|---|---|---|---|
| 5,095,344 | A | 3/1992 | Harari |
| 6,486,509 | B1 * | 11/2002 | Van Houdt ............... 257/319 |
| 6,670,671 | B2 | 12/2003 | Sasago |
| 6,849,502 | B2 | 2/2005 | Sasago |
| 2004/0065917 | A1 * | 4/2004 | Fan et al. ................ 257/315 |
| 2004/0084706 | A1 | 5/2004 | Osabe |
| 2004/0084714 | A1 | 5/2004 | Ishii |
| 2004/0104425 | A1 | 6/2004 | Kobayashi |
| 2005/0173751 | A1 | 8/2005 | Ishii |
| 2005/0280000 | A1 | 12/2005 | Ishii |
| 2006/0001081 | A1 | 1/2006 | Sasago |

OTHER PUBLICATIONS

Akil, "Optimization of Embedded Compact Nonvolatile Memories for Sub-100-nm CMOS Generations", IEEE Transactions on Electron Devices, Apr. 2005, pp. 492-499, vol. 52, Issue: 4, IEEE, USA.
Lee, "An 18Mb Serial Flash EEPROM for Solid-State Disk Applications", Symposium on VLSI Circuits Digest of Technical Papers, 1994, pp. 59-60, IEEE, USA.
Kobayashi, "A Giga-Scale Assist-Gate (AG)-And-Type Flash Memory Cell with 20-MB/s Programming Throughput for Content-Downloading Applications", IEDM Technical Digest, 2001, pp. 2.2.1-2.2.4, IEEE International, USA.
Sasago, "90-nm-node multi-level AG-And type flash memory with cell size of true 2 F2/bit and programming throughput of 10 MB/s", IEDM Technical Digest, 2003, pp. 34.2.1-34.2.4, IEEE International, USA.

* cited by examiner

*Primary Examiner*—Kiesha L. Rose
*Assistant Examiner*—Tucker Wright
(74) *Attorney, Agent, or Firm*—Edward S. Wright

(57) ABSTRACT

Semiconductor memory array and process of fabrication in which a plurality of bit line diffusions are formed in a substrate, and memory cells formed in pairs between the bit line diffusions, with each of the pairs of cells having first and second conductors adjacent to the bit line diffusions, floating gates beside the first and second conductors, an erase gate between the floating gates, and a source line diffusion in the substrate beneath the erase gate, and at least one additional conductor capacitively coupled to the floating gates. In some disclosed embodiments, the conductors adjacent to the bit line diffusions are word lines, and the additional conductors consist of either a pair of coupling gates which are coupled to respective ones of the floating gates or a single coupling gate which is coupled to both of the floating gates. In another embodiment, the conductors adjacent to the bit line diffusions are program lines, and the third conductors are word lines which extend in a direction perpendicular to the program lines and the diffusions.

17 Claims, 14 Drawing Sheets

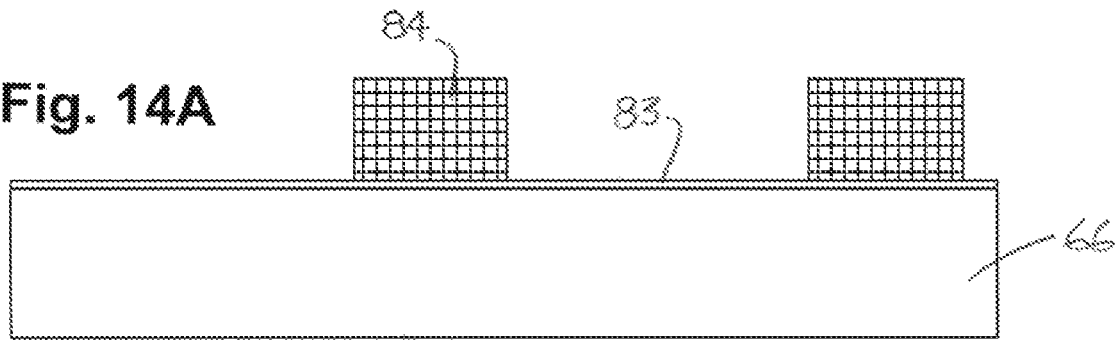
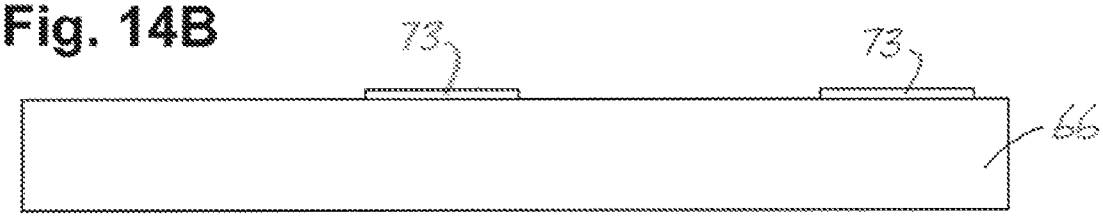
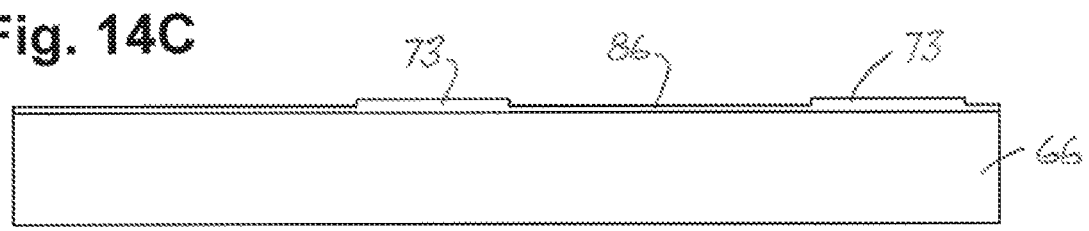
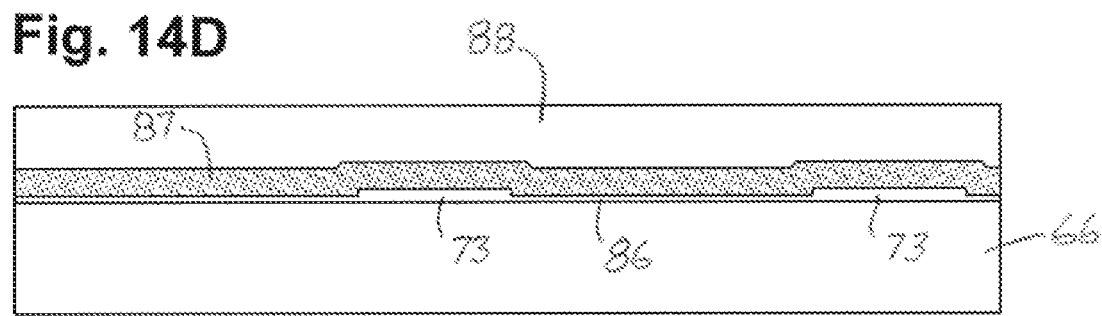

Fig. 14I
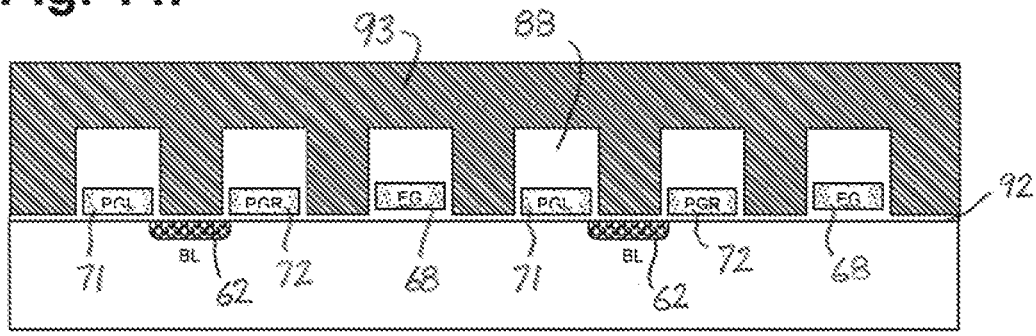
Fig. 14J
Fig. 14K
Fig. 14L
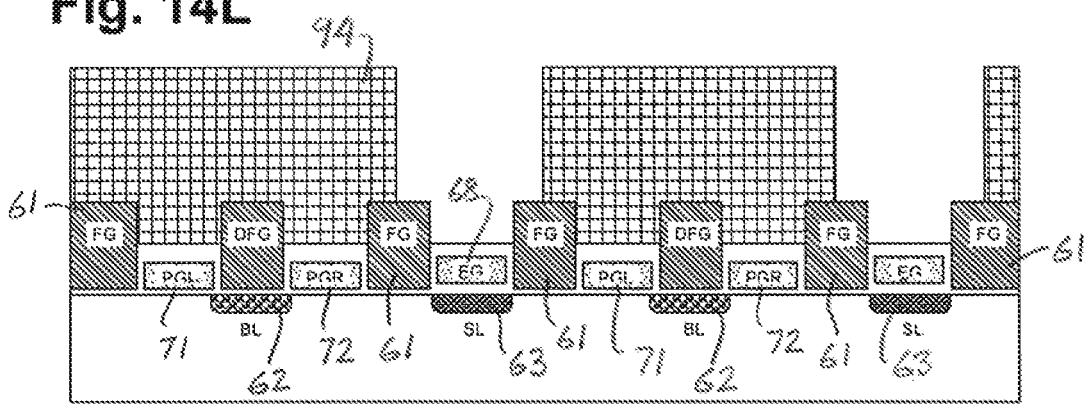

NOR FLASH MEMORY

BACKGROUND OF THE INVENTION

1. Field of Invention

This invention pertains generally to semiconductor memory devices and, more particularly, to a NOR flash memory and process of fabricating the same.

2. Related Art

Nonvolatile memory is currently available in several forms, including electrically programmable read only memory (EPROM), electrically erasable programmable read only memory (EEPROM), and flash EEPROM. Flash memory has been widely used for high volume data storage in devices such as memory cards, personal digital assistants (PDA's), cellular phones, and MP3 players.

OBJECTS AND SUMMARY OF THE INVENTION

It is in general an object of the invention to provide a new and improved semiconductor memory device and process of fabricating the same.

Another object of the invention is to provide a semiconductor memory device and process of the above character which overcome limitations and disadvantages of the prior art.

These and other objects are achieved in accordance with the invention by providing a semiconductor memory array and process of fabrication in which a plurality of bit line diffusions are formed in a substrate, and memory cells formed in pairs between the bit line diffusions, with each of the pairs of cells having first and second conductors adjacent to the bit line diffusions, floating gates beside the first and second conductors, an erase gate between the floating gates, and a source line diffusion in the substrate beneath the erase gate, and at least one additional conductor capacitively coupled to the floating gates.

In some disclosed embodiments, the conductors adjacent to the bit line diffusions are word lines, and the additional conductors consist of either a pair of coupling gates which are coupled to respective ones of the floating gates or a single coupling gate which is coupled to both of the floating gates.

In another embodiment, the conductors adjacent to the bit line diffusions are program lines, and the third conductors are word lines which extend in a direction perpendicular to the program lines and the diffusions.

DETAILED DESCRIPTION

Figure 1:
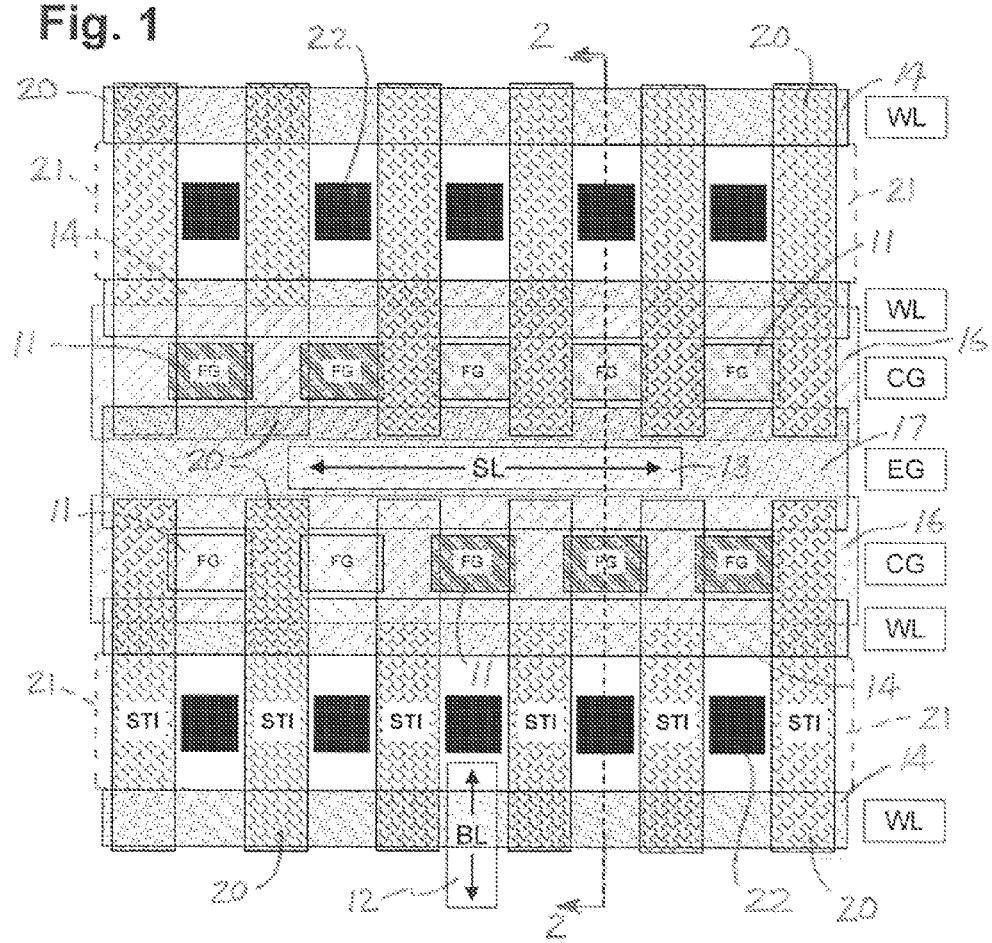
FIG. 1 is a top plan view of one embodiment of a NOR flash memory cell array incorporating the invention.

As illustrated in FIG. 1, the memory includes an array of NOR-type split-gate flash memory cells, each of which has a floating gate 11 that is charged either negatively or positively, depending upon the state ("0" or "1") of the cell. The array is arranged in rows and columns, with bit lines 12 running vertically and source lines 13, word lines 14, coupling gates 16, and erase gates 17 all running horizontally and perpendicular to the bit lines. The array is formed on a substrate 19 which can be either a P-type silicon substrate or an N-type silicon substrate in which a P-well is formed.

Figure 2:
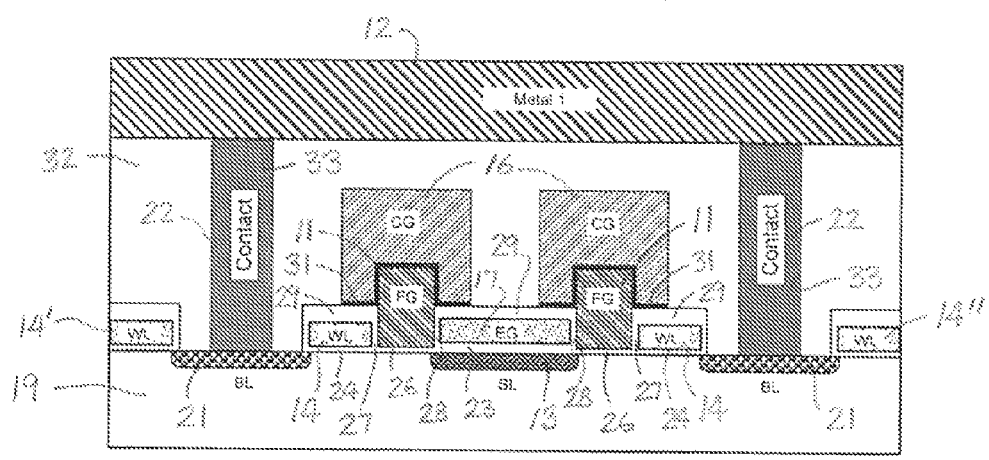
FIG. 2 is a cross-sectional view taken along line 2-2 in FIG. 1.

As best seen in FIG. 2, the cells in each column are arranged in pairs between bit line diffusions 21 in the substrate. In addition to the floating gate 11, each cell also includes a word line 14 and a coupling gate 16, with the word line being positioned between the floating gate and one of the bit line diffusions and the coupling gate being positioned generally above the floating gate. The two cells in the pair share a common source diffusion 13 and a common erase gate 17 which are positioned between the floating gates. The bit line 12 for the column in which the cells are located is connected to the bit line diffusions by contacts 22.

The cells in adjacent columns are separated and isolated from each other by shallow trench isolation regions 20 which extend between and separate the floating gates and the bit line diffusions in adjacent cells, while allowing the source line diffusions, the erase gates, the control gates, the word lines, and the bit lines to run through.

Floating gates 11 are fabricated of polysilicon doped with phosphorus, arsenic or boron to a level on the order of $10^{20}$ to $10^{21}$ per cm$^3$, and have a thickness or height on the order of 730 Å to 1900 Å, with the outer edge portions of the floating gates being aligned with the outer edge portions of source line diffusion 13.

Word lines 14 and erase gate 17 are also fabricated of polysilicon which is doped with phosphorus, arsenic or boron to a level on the order of $10^{20}$ to $10^{21}$ per cm$^3$, and they each have a thickness or height on the order of 300 Å to 1000 Å. The erase gate is positioned directly above the source line diffusion and is insulated from it by an oxide layer 23 having a thickness on the order of 150 Å to 250 Å. Word lines 14 are separated from the upper surface of the substrate by oxide layers 24 which have a thickness on the order of 30 Å to 100 Å.

Floating gates 11 are insulated from the upper surface of the substrate by oxide layers 26 which have a thickness on the order of 100 Å and from the side walls of word lines 14 and erase gate 17 by oxide layers 27, 28 having a thickness on the order of 150 Å. An oxide or nitride layer 29, formed by chemical vapor deposition (CVD) and having a thickness on the order of 400 Å to 800 Å, overlies the word lines and the erase gates.

The upper portions of the floating gates extend above oxide/nitride layer 29, and coupling gates 16 are centered above the floating gates. The coupling gates are wider than the floating gates, with the outer portions of the coupling gates extending down along the sides of the floating gates to the oxide/nitride layer, with the lower portions of the coupling gates thus overlapping and embracing the upper portions of the floating gates to provide extended areas of capacitive coupling between the coupling gates and the floating gates. The coupling gates are also fabricated of polysilicon doped with phosphorus, arsenic or boron to a level on the order of $10^{20}$ to $10^{21}$ per cm$^3$, and have a thickness or height on the order of 1000 Å to 2500 Å above the oxide/nitride layer. A dielectric layer 31 having a thickness on the order of 100 Å to 200 Å separates each of the coupling gates from the upper portion of the floating gate and from the oxide/nitride layer. The dielectric can be either a pure oxide film, a nitrided oxide film, or a combination of oxygen, nitride and oxide (ONO) layers such as a layer of nitride between two layers of oxide.

A glass material 32 such as phosphosilicate glass (PSG) or borophosphosilicate glass (BPSG) extends over the entire wafer, with bit lines 12 on top of the glass material and bit line contacts 22 extending through openings 33 in it.

Bit line diffusions 21 are shared by the cells in adjacent pairs in the column, and the word lines 14', 14" for the cells in the adjacent pairs are shown in FIG. 2.

Figure 3:
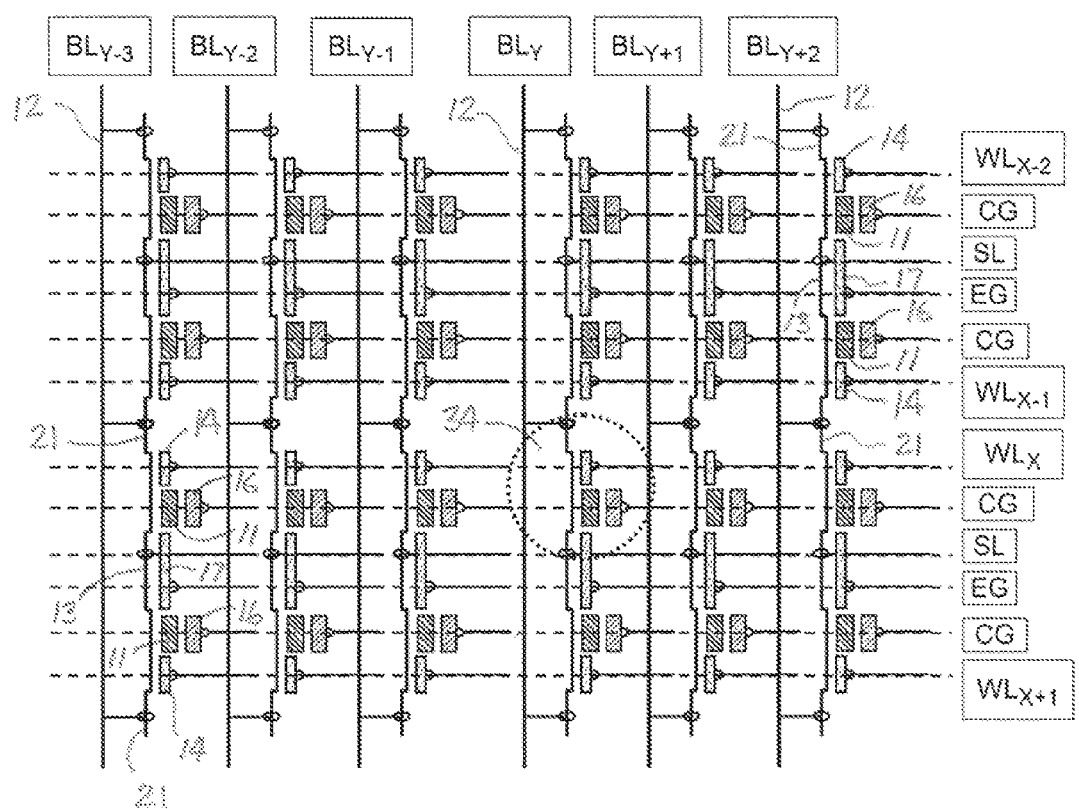
FIG. 3 is a circuit diagram of the embodiment of FIG. 1 in a 6×4 cell array.

FIG. 3 illustrates a memory block or array having 6 columns and 4 rows of the NOR-type split-gate cell array shown in FIG. 1. Each row has one word line, and each column has one bit line. For a given application, the array can have any desired number rows and columns, and a typical block can, for example, have 8 rows (8 word lines) and 4K columns (4096 bit lines). The source lines, erase gates and coupling gates for all 8 rows in the block can be grouped together and connected to just one terminal each to simplify array decoding. The individual cells are selected by addressing the word lines and bit lines, and in the embodiment of FIG. 3, for example, cell 34 is selected by addressing word line $WL_x$ and bit line $BL_y$. The other word lines and bit lines are unselected, as are the source lines, erase gates and coupling gates in other blocks.

A selected cell is programmed or set to a logic 0 state by hot carrier injection to the floating gate, and it is erased or returned to a logic 1 state by electron tunneling from the floating gate to the erase gate.

The operating conditions for the different cell array operations are summarized in Table 1.

and the source line can be at either 0V or 5V. Erase time is on the order of 1-10 ms, with electrons tunneling from the floating gate to the erase gate. Erasing can also be done by applying 10V to the erase gate without applying any voltage to the coupling gate.

When the negative voltage is applied to the coupling gate, it is coupled to the floating gate, and the high negative potential on the floating gate enhances electron coupling and allows a lower voltage to be applied to the erase gate. However, if the oxide or dielectric between the erase gate and the source line is thick enough, the erase gate can sustain a voltage (e.g., 10-15V) which is high enough to cause electron tunneling from the floating gate to the erase gate without applying any negative potential to the coupling gate and without causing oxide breakdown between the erase gate and the source line. With the NOR-type split-gate cells, the cells can be over-erased, i.e., erased to the negative threshold voltage.

The selected cell is read by applying $V_{CC}$ to the coupling gate and the word line and Vr to the bit line.

Figure 4A:
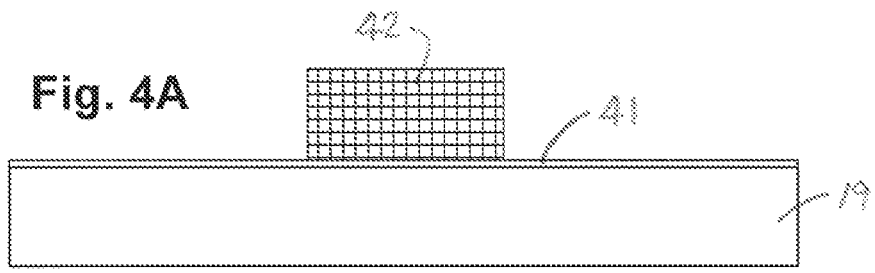
FIGS. 4A-4Q are cross-sectional views illustrating the steps in one embodiment of a process for fabricating the memory cell array of FIG. 1 in accordance with the invention.
Figure 4B:
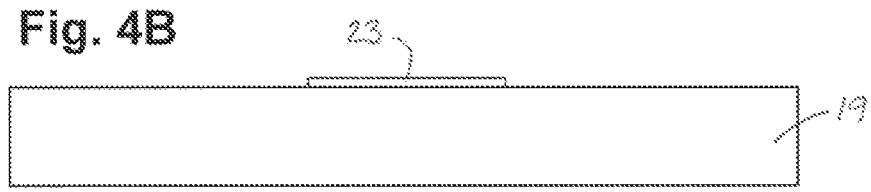
Figure 4C:
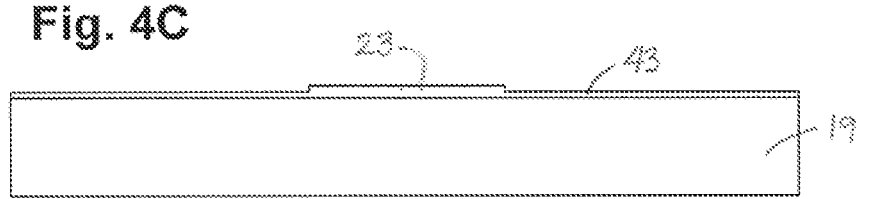
Figure 4D:
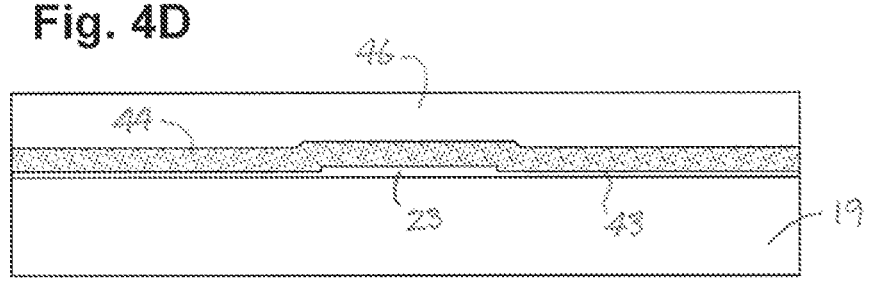
Figure 4E:
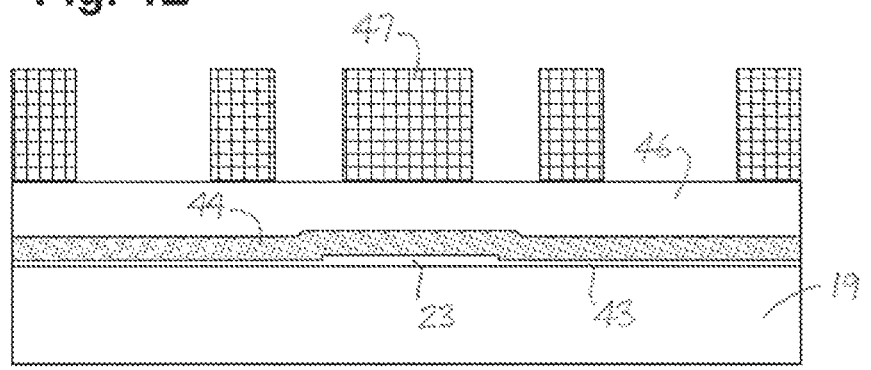
Figure 4F:
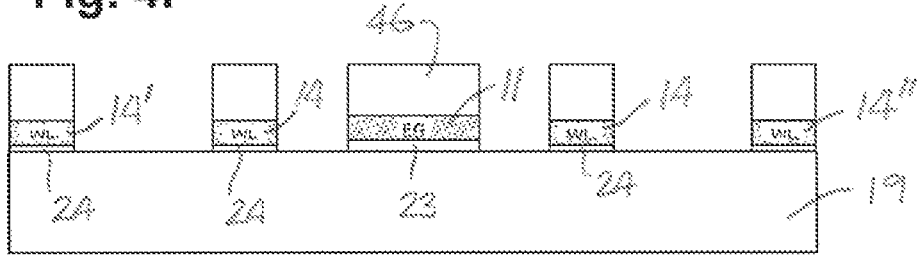
Figure 4G:
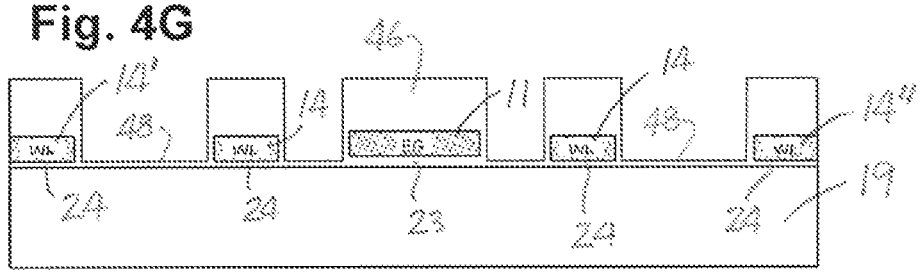
Figure 4H:
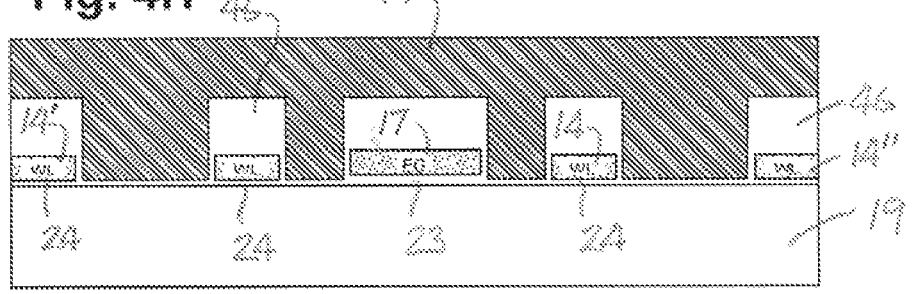
Figure 4I:
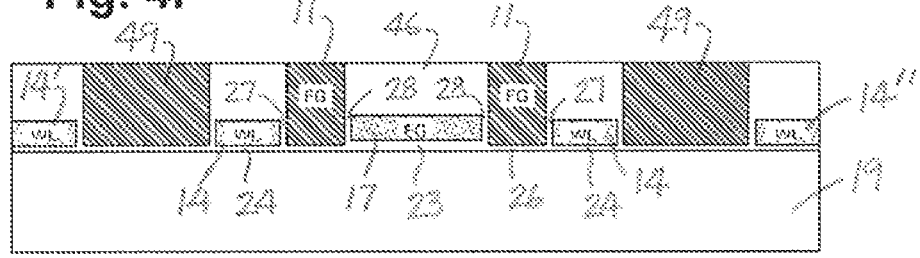
Figure 4J:
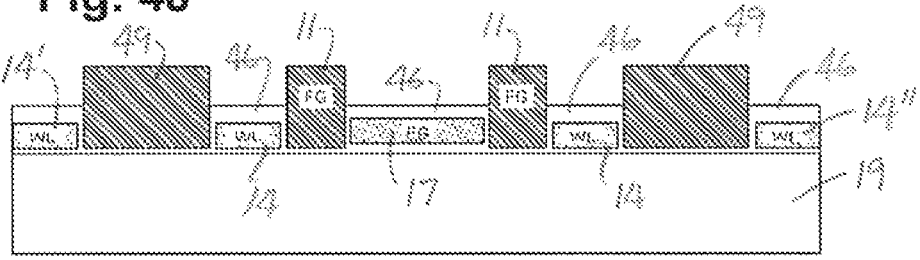
Figure 4K:
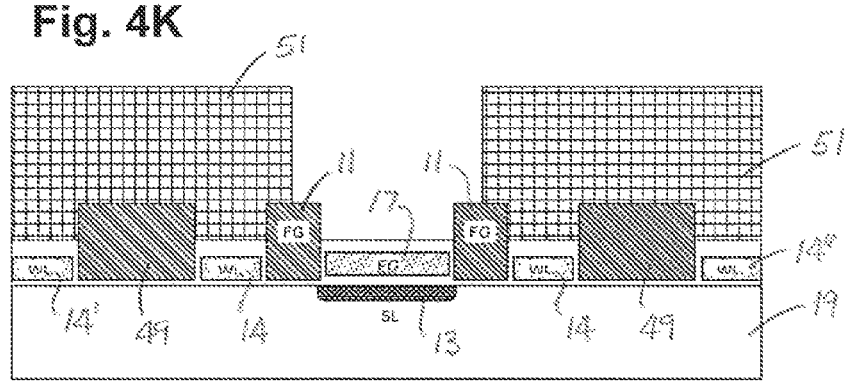
Figure 4L:
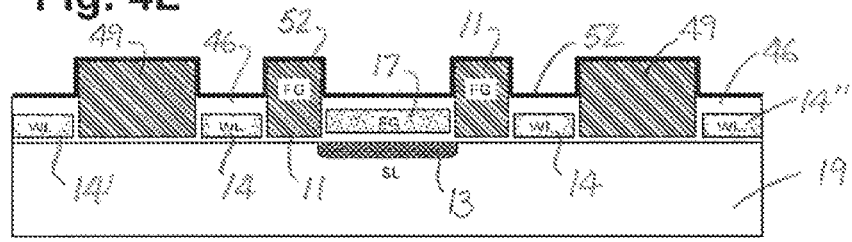
Figure 4M:
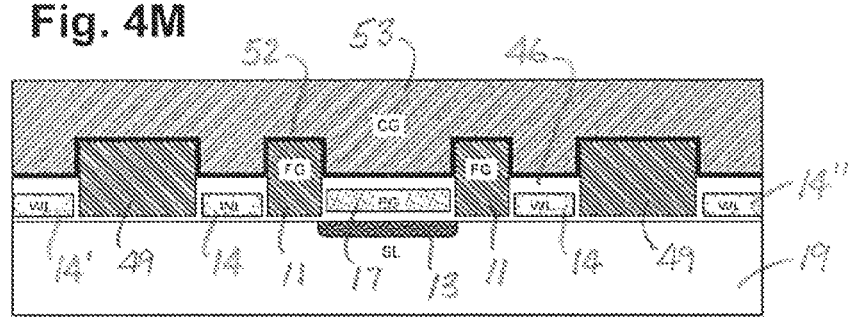
Figure 4N:
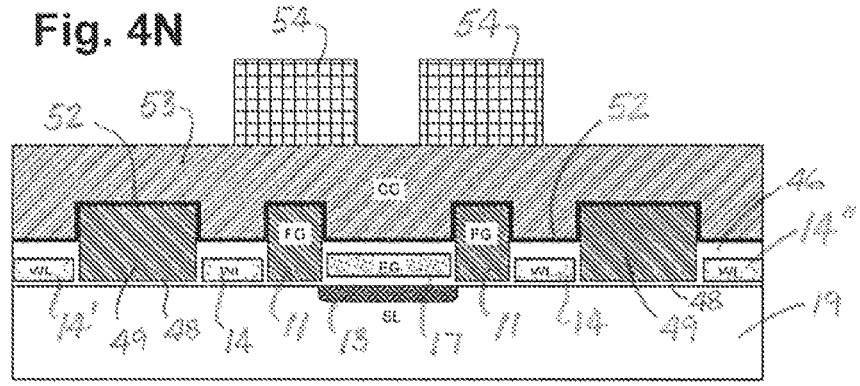
Figure 4O:
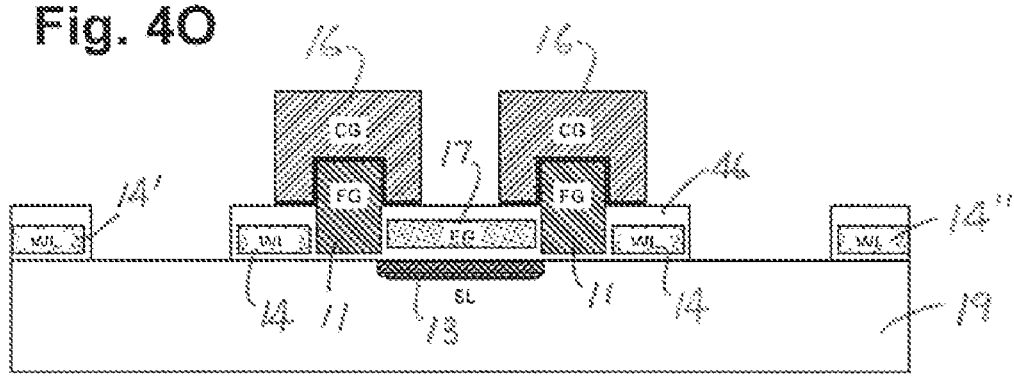
Figure 4P:
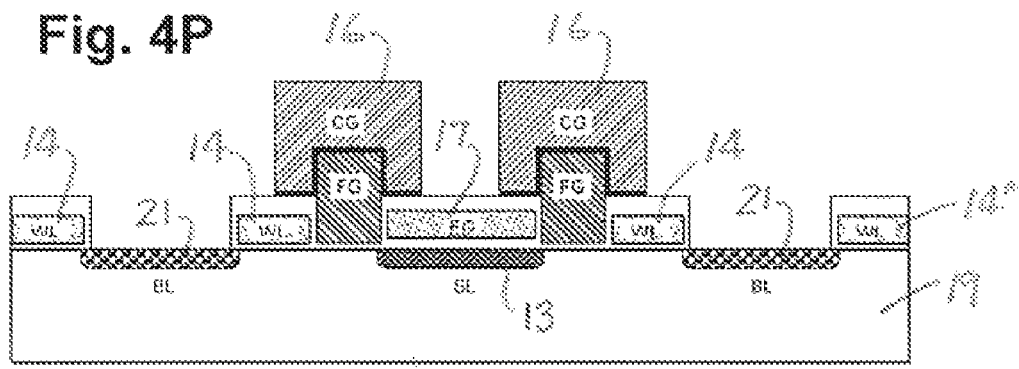
Figure 4Q:
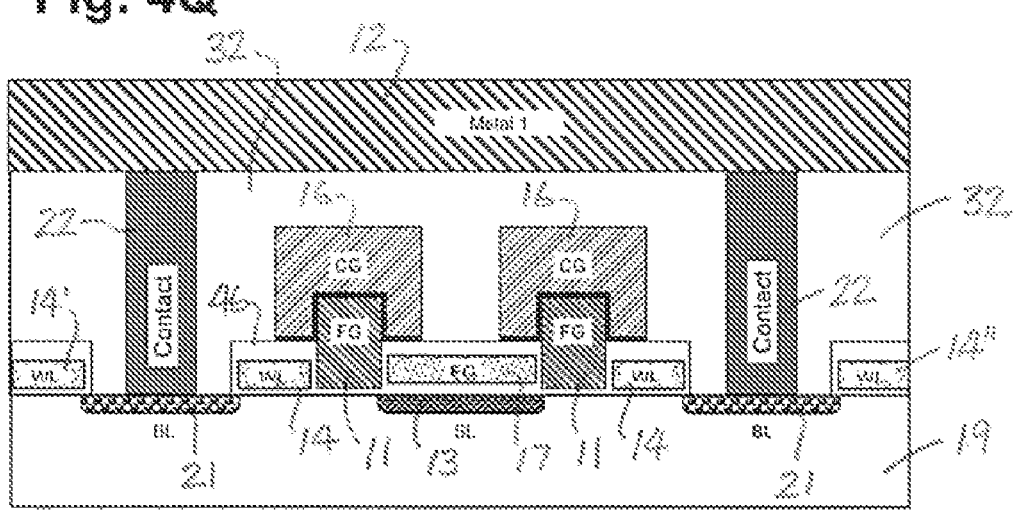

The memory cell array of FIG. 1 can be fabricated by the process illustrated in FIGS. 4A-4Q. Shallow trenches are formed in silicon substrate 19 to a depth on the order of about 0.15 μm to 0.30 μm and filled with a combination of thermally grown oxide and high density plasma deposited oxide which is planarized to expose active areas of the silicon. The trenches run in a direction parallel to the plane of the page in FIGS. 4A-4Q.

An oxide layer 41 having a thickness on the order of 100 Å to 200 Å is thermally grown on the substrate. A photolithographic mask 42 is formed on the oxide layer in the area in which the erase gate is to be formed. The unprotected oxide is then removed by wet or dry etching, leaving a strip of oxide which extends in a direction perpendicular to the page in FIG. 4B to form erase gate oxide 23.

After the mask is stripped away, another oxide layer 43 having a thickness on the order of 30 Å to 100 Å is thermally grown or deposited over the substrate and erase gate oxide 23, as shown in FIG. 4C, increasing the thickness of the erase gate oxide to about 150 Å to 250 Å.

A conductive layer 44 of polysilicon (poly-1) is deposited over the oxide between the isolation regions to a thickness on the order of 300 Å to 1000 Å, as shown in FIG. 4D. The polysilicon is doped with phosphorus, arsenic or boron to a

TABLE 1

| | Coupling Gate | | Word Line | | Source Line | | Erase Gate | | Bit Line | |
|---|---|---|---|---|---|---|---|---|---|---|
| | Sel | Un | Sel | Un | Sel | Un | Sel | Un | Sel | Un |
| Standby | 0 | 0 | 0 | 0 | 0 | 0 | 0 | 0 | 0 | 0 |
| Read | $V_{cc}$ | 0 | $V_{cc}$ | 0 | 0 | 0 | 0 | 0 | Vr | 0 |
| Program | 9 V | 0 | 1.6 V | 0 | 5.0 V | 0 | 5.0 V | 0 | Ip | $V_{cc}$ |
| Erase (1) | −10 V | 0 | 0 | 0 | 0/5.0 V | 0 | 5.0 V | 0 | 0 | 0 |
| Erase (2) | 0 | 0 | 0 | 0 | 0 | 0 | 10 V | 0 | 0 | 0 |

Programming can be done on a bit-by-bit basis, with 9V being applied to the coupling gate to provide coupling to the floating gate during hot electron programming and 5.0 volts being applied to the source line and to the erase gate. A voltage of about 1.6 volts is applied to the word line and a programming current $I_P$ is applied to the bit line. That current is typically on the order of 1-10 μA, although it can be as low as 0.1 μA in some applications.

Erasing can be done in one of two ways. In the first, −10V is applied to the coupling gate, 5V is applied to the erase gate, level on the order of $10^{20}$ to $10^{21}$ per cm$^3$. An oxide or nitride layer 46 having a thickness on the order of 600 Å to 1000 Å is formed on the poly-1 layer by chemical vapor deposition (CVD) and serves as a mask to prevent the poly-1 material from etching away during subsequent dry etching steps.

As shown in FIG. 4E, another mask 47 is employed on the CVD layer to define the word lines and the erase gate. The unmasked portions of CVD layer 46 and poly-1 layer 44 are etched away anisotropically, leaving only the portions of the poly-1 material which form word lines 14 and erase gate 17, as shown in FIG. 4F. At the same time, the unmasked portions of oxide layer 43 are also etched away, leaving only the portions which form erase gate oxide 23 and the oxide layers 24 beneath the word lines.

Next, another oxide layer 48 is either thermally grown or deposited over the exposed portions of the substrate and along the side walls of word lines 14, erase gate 17, and the CVD layer above them. Oxide layer 48 has a thickness on the order of 100 Å on the substrate and about 100 Å to 150 Å on the side walls of the word lines and the erase gate. The difference in thickness can be achieved either by enhanced oxidation of polysilicon or by the use of a sacrificial oxidation which is etched back by anisotropic dry etching to leave an initial layer having a thickness of about 50 Å on the side walls before layer 48 is formed.

A second conductive layer 49 of polysilicon (poly-2) is deposited over oxide layer 48, as shown in FIG. 4H. The poly-2 layer has a thickness on the order of 1000 Å to 2000 Å and is doped with phosphorus, arsenic or boron to a level on the order of $10^{20}$ to $10^{21}$ per $cm^3$. The poly-2 fills up the gaps between the CVD/poly-1 stacks and is etched back to or slightly below the top of the CVD layer to form floating gates 11 over the memory channels between word lines 14 and erase gate 17, as illustrated in FIG. 4I.

The upper portion of CVD layer 46 is then removed to expose the upper portions of the floating gates, as shown in FIG. 4J. The CVD oxide or nitride can be etched back by a dry anisotropic etch, leaving about 400 Å to 800 Å of the CVD material over the word lines and the erase gate.

At this point, the floating gates are in the form of strips which extend in the direction of the rows, i.e., perpendicular to the plane of the page in FIG. 4J. In order to form the floating gates into individual islands for the individual cells, another mask (not shown) is formed over the areas where the floating gates are to be located, and the unmasked portions of the strips are etched away, leaving the individual floating gates.

Source line diffusion 13 is then formed in the substrate directly beneath erase gate 17 by high energy implantation of phosphorous or arsenic, using another photolithographic mask 51, as shown in FIG. 4K.

A dielectric layer 52 having a thickness on the order of 100 Å to 200 Å is deposited on the exposed surfaces of floating gates 11, erase gate 17, and oxide or nitride layer 46, as shown in FIG. 4L. The dielectric material can be either a pure oxide film, a nitrided oxide film, or a combination of oxide, nitride and oxide (ONO) layers such as a layer of nitride between two layers of oxide.

A third conductive layer 53 of polysilicon (poly-3) is then deposited over the dielectric layer, as shown in FIG. 4M. The poly-3 layer has a thickness on the order of 1000 Å to 2500 Å and is doped with phosphorus, arsenic or boron to a level on the order of $10^{20}$ to $10^{21}$ per $cm^3$. A mask 54 is formed over the poly-3 layer to define the coupling gates, as shown in FIG. 4N, and the unmasked portions of the poly-3 material and the portions of dielectric layer 52 beneath them are removed in another dry anisotropic etching step. CVD layer 46 protects the word lines and the erase gate, but the unprotected portions of the poly-2 layer 49 between the word lines and the portions of oxide layer 48 beneath them are also removed in this step, leaving the structure shown in FIG. 4O.

Bit line diffusions 21 are then formed in the substrate between the word lines and between the isolation regions which separate the cells in adjacent columns by high energy implantation of phosphorous or arsenic, as shown in FIG. 4P, and a glass material 32 such as phosphosilicate glass (PSG) or borophosphosilicate glass (BPSG) is deposited over the entire wafer. Bit line contact openings 33 are formed in the glass, and a metal layer is deposited over the glass and patterned to form bit lines 12 and bit line contacts 22, as shown in FIG. 4Q.

Figure 5:
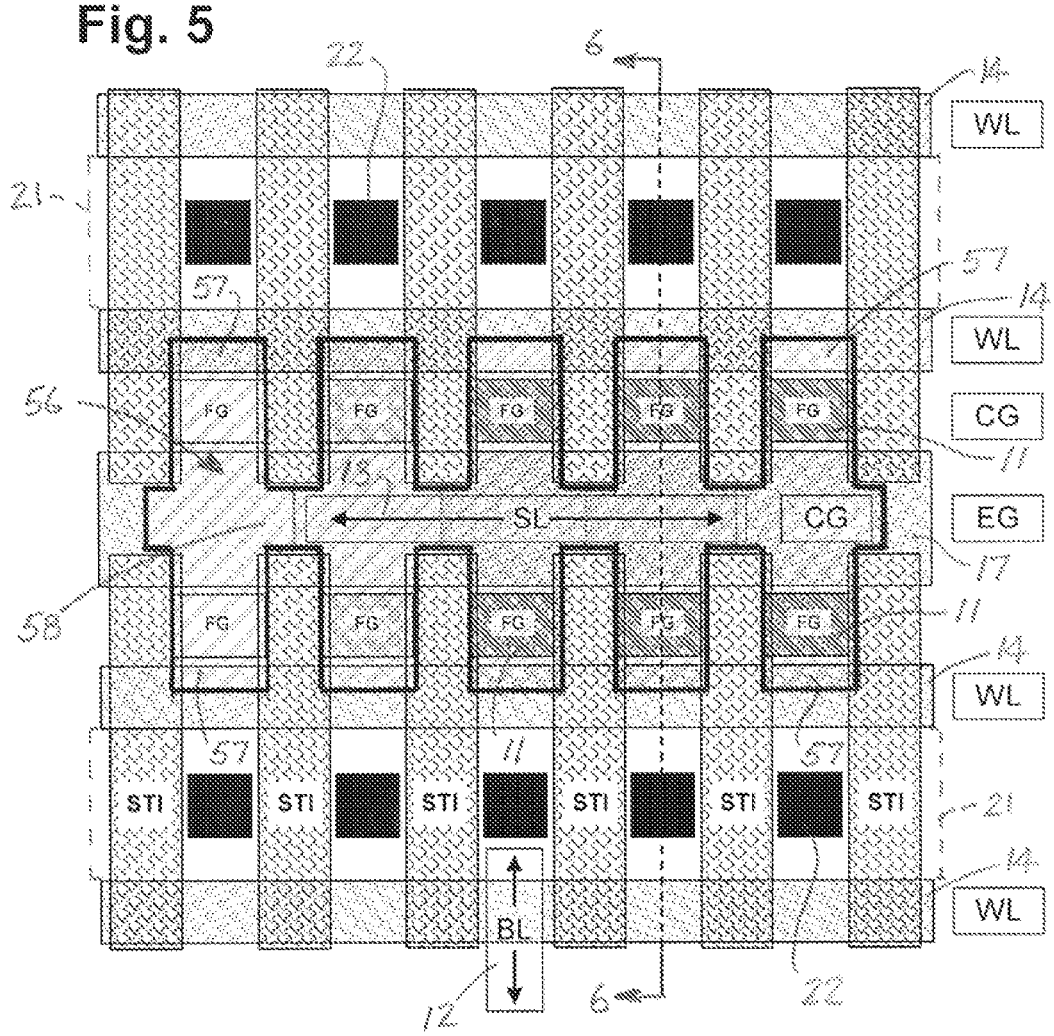
FIG. 5 is a top plan view of another embodiment of a NOR flash memory cell array incorporating the invention, with the coupling gate drawn in heavy solid lines in order to better illustrate its contour.
Figure 6:
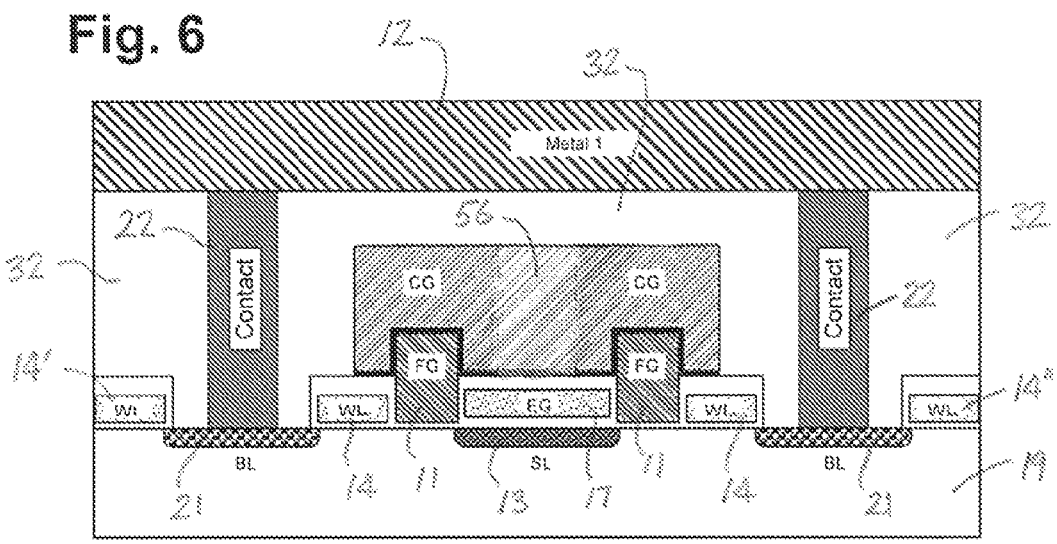
FIG. 6 is a cross-sectional view taken along line 6-6 in FIG. 5.

The embodiment shown in FIG. 5 is similar to the embodiment of FIG. 1 except that each pair of cells has a single coupling gate 56 rather than each cell having its own individual coupling gate. Coupling gate 56 also has a different configuration than coupling gates 16, as can be seen by comparing FIGS. 1 and 5. Whereas that each of the individual coupling gates 16 has a rectangular shape or configuration in plan view, coupling gate 56 has a plurality of generally rectangular arms or fingers 57 which extend at right angles from a central rectangular trunk 58. The trunk extends in the direction of the rows, and the fingers extend in the direction of the columns, with each of the fingers overlying one of the floating gates 11.

The embodiment of FIG. 5 can be fabricated by the same process as the embodiment of FIG. 1 except for the manner in which the coupling gates and the floating gates are formed. Instead of using a pair of rectangular masks to define the coupling gates, as shown in FIG. 4N, the mask for the coupling gates is patterned to have the fingered configuration shown in FIG. 5. With this mask, it is not necessary to perform separate masking and etching steps on the strips of poly-2 material to form the individual islands for the floating gates because the portions of the poly-2 strips which are not covered by fingers will be etched away when the poly-3 layer is etched to form the coupling gate. Thus, the floating gates are formed in the same step as the coupling gate and are self-aligned with the fingers of the coupling gate.

Figure 7:
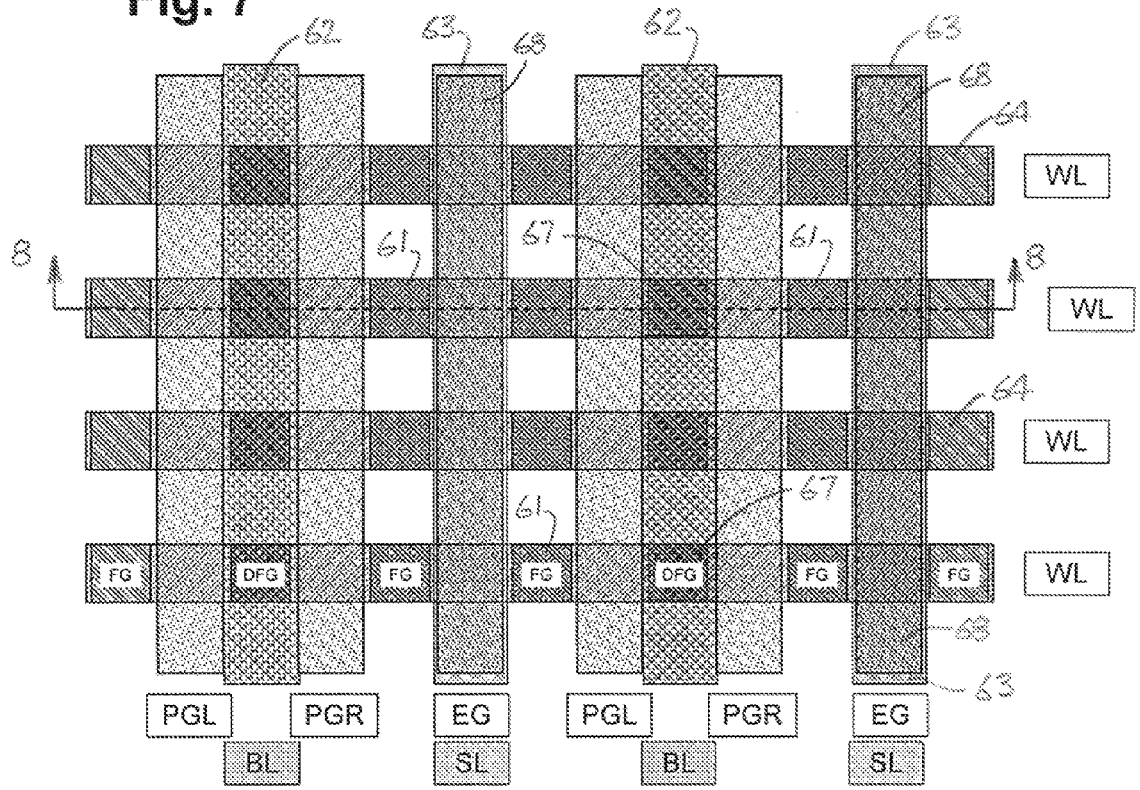
FIG. 7 is a top plan view of another embodiment of a memory cell array incorporating the invention.
Figure 8:
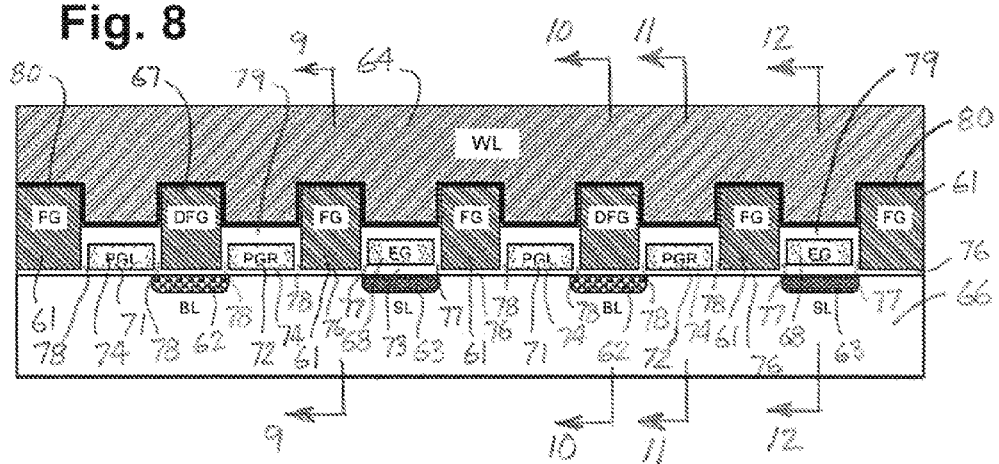
FIG. 8 is a cross-sectional view taken along line 8-8 in FIG. 7.
Figure 9:
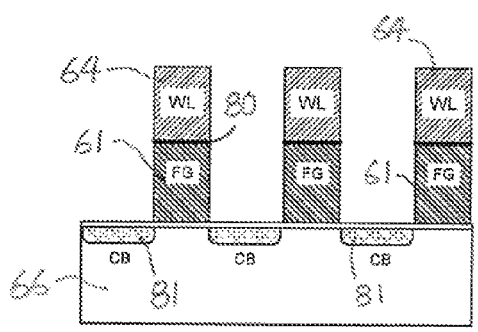
FIGS. 9-12 are cross-sectional views taken along lines 9-9, 10-10, 11-11, and 12-12 in FIG. 8.
Figure 10:
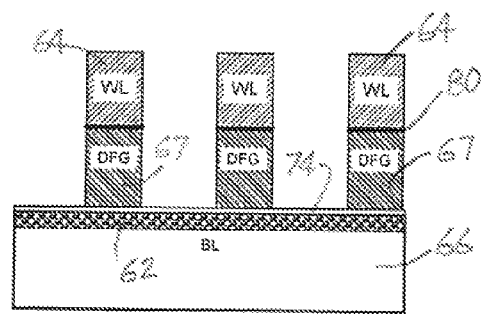
Figure 11:
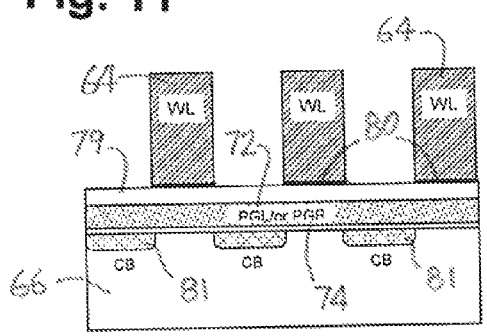
Figure 12:
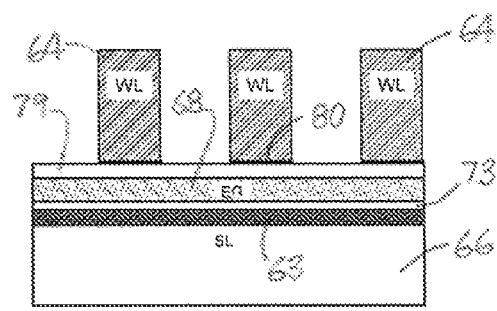

The embodiment illustrated in FIG. 7 is a contactless array of split-gate flash memory cells with floating gates 61. As in the other embodiments, the array is arranged in rows and columns, with bit line diffusions 62 and source line diffusions 63 extending in one direction parallel to each other. In this embodiment, however, word line conductors 64 extend in a second direction perpendicular to the diffusions and serve as coupling gates for the floating gates beneath them. The array is formed on a substrate 66.

Each floating gate represents a memory cell or unit which can be charged either negatively or positively in accordance with the logic state ("0" or "1") stored therein.

As in the embodiments of FIGS. 1 and 5, the memory cells are arranged in pairs between bit line diffusions 62 in the substrate, with cells in each pair sharing a common source line diffusion 63 which is positioned midway between the bit lines. Floating gates 61 are positioned on both sides of the source line diffusions, dummy floating gates 67 are positioned above the bit line diffusions, and erase gates 68 are positioned above the source line diffusions.

Program gates 71, 72 are positioned on opposite sides of the bit line diffusions and extend in a direction parallel to the bit line diffusions and the source line diffusions. The program gates 71 to the left of the bit lines are referred to as left side program gates and designated PGL, and the program gates 72 to the right of the bit lines are referred to as right side program gates and designated PGR.

Floating gates 61 are fabricated of polysilicon doped with phosphorus, arsenic or boron to a level on the order of $10^{20}$ to $10^{21}$ per $cm^3$, and have a thickness or height on the order of 730 Å to 1900 Å, with the outer edge portions of the floating gates being aligned with the outer edge portions of source line diffusion 63.

Erase gate 68 and program gates 71, 72 are also fabricated of polysilicon which is doped with phosphorus, arsenic or boron to a level on the order of $10^{20}$ to $10^{21}$ per $cm^3$, and they each have a thickness or height on the order of 300 Å to 1000

Å. The erase gate is positioned directly above the source line diffusion and is insulated from it by an oxide layer 73 having a thickness on the order of 150 Å to 250 Å. Program gates 71, 72 are separated from the upper surface of the substrate by oxide layers 74 which have a thickness on the order of 30 Å to 100 Å.

Floating gates 61 are insulated from the upper surface of the substrate by oxide layers 76 which have a thickness on the order of 100 Å and from the side walls of erase gate 68 and program gates 71, 72 by oxide layers 77, 78 having a thickness on the order of 150 Å. An oxide or nitride layer 79, formed by chemical vapor deposition (CVD) and having a thickness on the order of 400 Å to 800 Å, overlies the erase gate and the programming gates.

Word line 64 crosses above the floating gates and the dummy floating gates and is separated from those gates and oxide or nitride layer 79 by a dielectric layer 80. The dielectric has a thickness on the order of 100 Å to 200 Å, and it can be either a pure oxide film, a nitrided oxide film, or a combination of oxide, nitride and oxide (ONO) layers such as a layer of nitride between two layers of oxide.

The lower portions of the word line overlap and embrace the upper portions of the floating gates to provide extended areas of capacitive coupling between the word line and the floating gates.

The word lines and floating gates in adjacent rows of the array are separated from each other, as can be seen in FIGS. 9-12, and boron or $BF_2$ channel block diffusions 81 are implanted in the substrate between the floating gates to electrically isolate the channels between the memory cells in adjacent rows.

Figure 13:
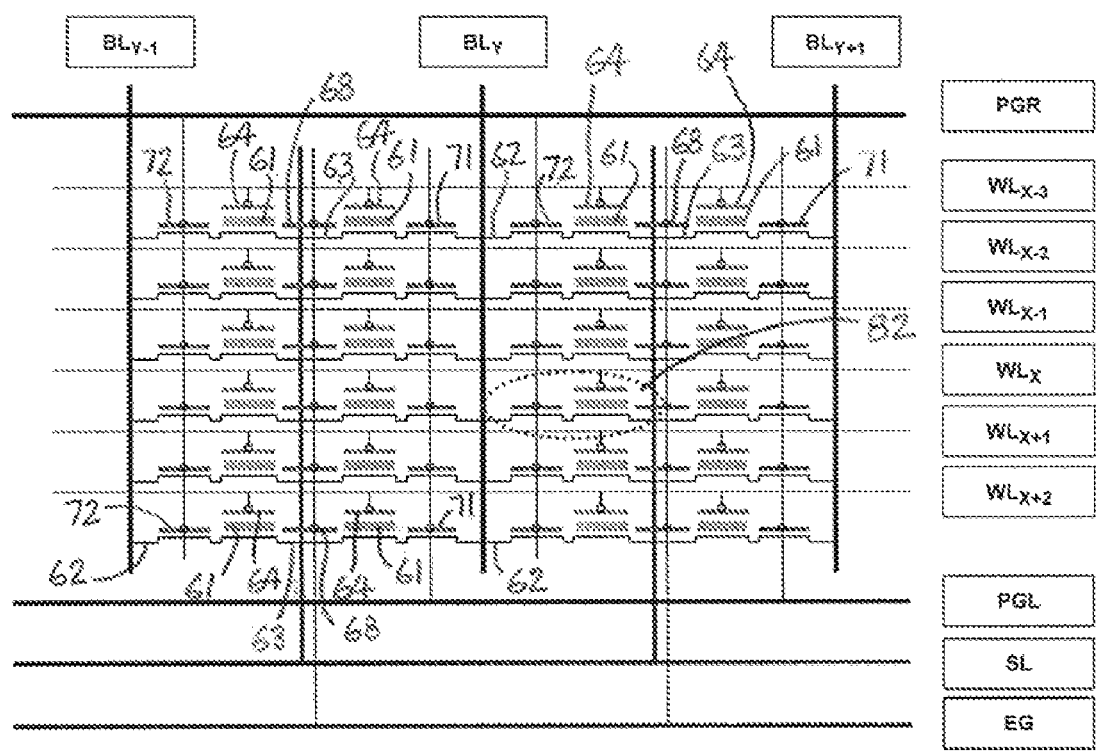
FIG. 13 is a circuit diagram of the embodiment of FIG. 7 in a 6×4 cell array.

FIG. 13 illustrates a memory block or array having 4 columns and 6 rows of the contactless cell array shown in FIG. 7. For a given application, the array can have any desired number rows and columns, and a typical block can, for example, have 64 rows (64 word lines) and 4K columns (4096 bit lines) without any contacts inside the array. The source lines, erase gates, left program gates (PGL's) and right program gates (PGR's) can be grouped together and connected to just one terminal each to simplify array decoding. The individual cells are selected by addressing the word lines, bit lines, and the program lines for the desired cell, with the other word lines, bit lines and program lines being unselected. In the embodiment of FIG. 13, for example, cell 82 is selected by addressing word line $WL_x$, bit line $BL_y$, and the PGR line A selected cell is programmed or set to a logic 0 state by hot carrier injection to the floating gate, and it is erased or returned to a logic 1 state by electron tunneling from the floating gate to the erase gate.

The operating conditions for the different cell array operations are summarized in Table 2.

Programming can be done on a bit-by-bit basis, with 9V being applied to the word line to select the cell and to provide coupling to the floating gate during hot electron programming and 5.0 volts being applied to the source line and to the erase gate. A voltage of about 1.6 volts is applied to the PGR line, and a programming current $I_P$ is applied to the bit line. That current is typically on the order of 1-10 μA, although it can be as low as 0.1 μA in some applications.

Erasing can be done in one of two ways. In the first, −10V is applied to the word line, 5V is applied to the erase gate, and the source line can be at either 0V or 5V. Erase time is on the order of 1-10 ms, with electrons tunneling from the floating gate to the erase gate. Erasing can also be done by applying 10V to the erase gate without applying any voltage to the word line.

When the negative voltage is applied to the word line, it is coupled to the floating gate, and the high negative potential on the floating gate enhances electron coupling and allows a lower voltage to be applied to the erase gate. However, if the oxide or dielectric between the erase gate and the source line is thick enough, the erase gate can sustain a voltage (e.g., 10-15V) which is high enough to cause electron tunneling from the floating gate to the erase gate without applying any negative potential to the coupling gate and without causing oxide breakdown between the erase gate and the source line.

With either type of erasing, the erasing continues until the threshold voltage of the memory cell is about 0.5V, and it can be shut off by applying 0V to the word line. With the contactless array, care should be taken to ensure that the memory cells are not overerased, i.e., erased to the negative threshold voltage.

With the additional −10V applied to the word line, the cell array can either be erased row by row or the whole array block can be erased at once, depending upon whether the −10V is applied row by row or applied to the whole array block.

When the erasing is done with just the 10V on the erase gate, the erasing cannot be done on a row by row basis, and the entire cell array is erased at once because all of the erase gates are connected to one terminal.

The selected cell is read by applying $V_{CC}$ to the program gate, 5V to the word line, and Vr to the bit line.

The memory cell array of FIG. 7 can be fabricated by the process illustrated in FIGS. 14A-14M. In this process, an oxide layer 83 having a thickness on the order of 100 Å to 200 Å is thermally grown on a P-type silicon substrate 66. A photolithographic mask 84 is formed on the oxide layer in the areas in which the erase gates are to be formed. The unprotected oxide is then removed by wet or dry etching, and the mask is stripped away, leaving strips of oxide which extend in a direction perpendicular to the page in FIG. 14B to form erase gate oxides 73.

TABLE 2

| | Program Gate | | Word Line | | Source Line | | Erase Gate | | Bit Line | |
|---|---|---|---|---|---|---|---|---|---|---|
| | Sel | Un | Sel | Un | Sel | Un | Sel | Un | Sel | Un |
| Standby | 0 | 0 | 0 | 0 | 0 | 0 | 0 | 0 | 0 | 0 |
| Read | $V_{cc}$ | 0 | 5 V | 0 | 0 | 0 | 0 | 0 | Vr | 0 |
| Program | 1.6 V | 0 | 9 V | 0 | 5.0 V | 0 | 5.0 V | 0 | Ip | $V_{cc}$ |
| Erase (1) | 0 | 0 | −10 V | 0 | 0/5.0 V | 0 | 5.0 V | 0 | 0 | 0 |
| Erase (2) | 0 | 0 | 0 | 0 | 0 | 0 | 10 V | 0 | 0 | 0 |

Another oxide layer 86 having a thickness on the order of 30 Å to 100 Å is thermally grown or deposited over the substrate and erase gate oxides 73, as shown in FIG. 14C, increasing the thickness of the erase gate oxides to about 150 Å to 250 Å.

A conductive layer 87 of polysilicon (poly-1) is deposited over the oxide to a thickness on the order of 300 Å to 1000 Å, as shown in FIG. 14D. The polysilicon is doped with phosphorus, arsenic or boron to a level on the order of $10^{20}$ to $10^{21}$ per $cm^3$. An oxide or nitride layer 88 having a thickness on the order of 600 Å to 1000 Å is formed on the poly-1 layer by chemical vapor deposition (CVD) and serves as a mask to prevent the poly-1 material from etching away during subsequent dry etching steps.

Figure 14E:
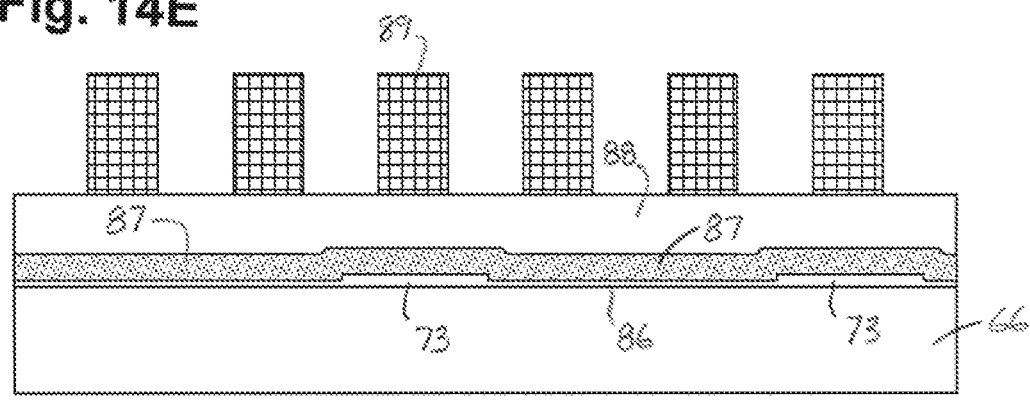
FIGS. 14A-14N are cross-sectional views illustrating the steps in one embodiment of a process for fabricating the memory cell array of FIG. 7 in accordance with the invention.
Figure 14F:
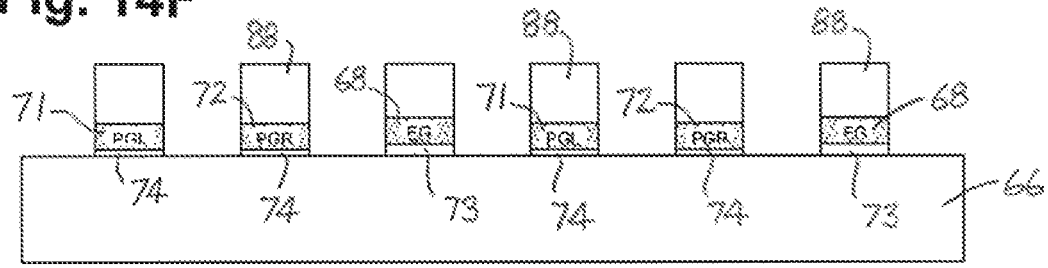

As shown in FIG. 14E, another mask 89 is employed on the CVD layer to define the program gates and the erase gates. The unmasked portions of CVD layer 88 and poly-1 layer 87 are etched away anisotropically, leaving only the portions of the poly-1 material which form program gates 71, 72 and erase gates 68, as shown in FIG. 14F. At the same time, the unmasked portions of oxide layer 86 are also etched away, leaving only the portions which form erase gate oxides 73 and the oxide layers 74 beneath the program gates.

Figure 14G:
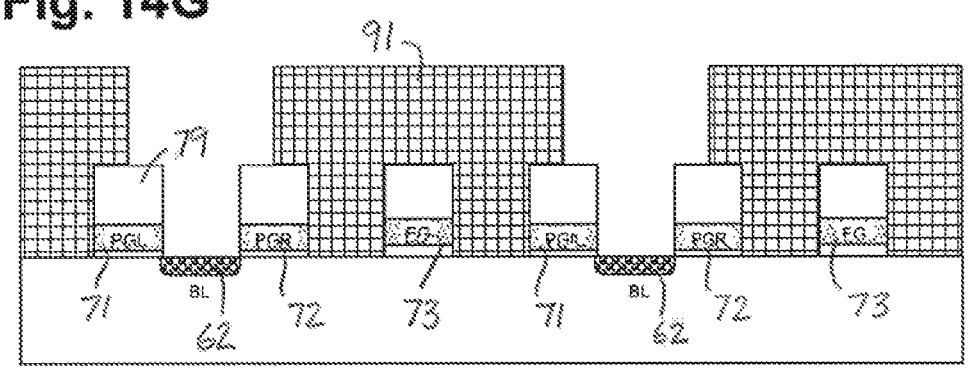

Bit line diffusions 62 are then formed between the left and right program gates by implantation with phosphorus or arsenic through a photolithographic mask 91, as shown in FIG. 14G. The implantation is heavy enough to form a buried N+ diffusion with low sheet resistance for the conductive layer.

Figure 14H:
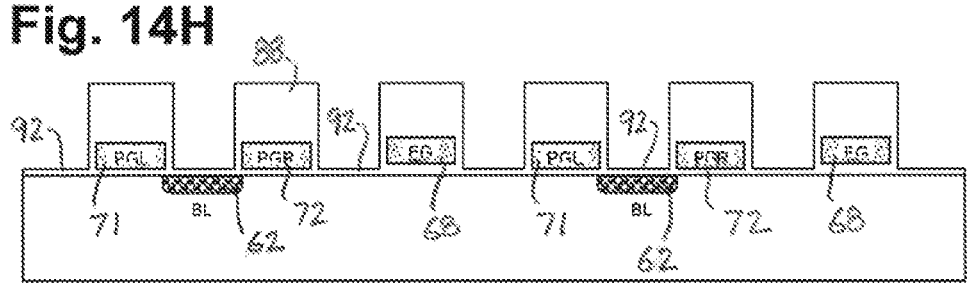
Figure 14M:
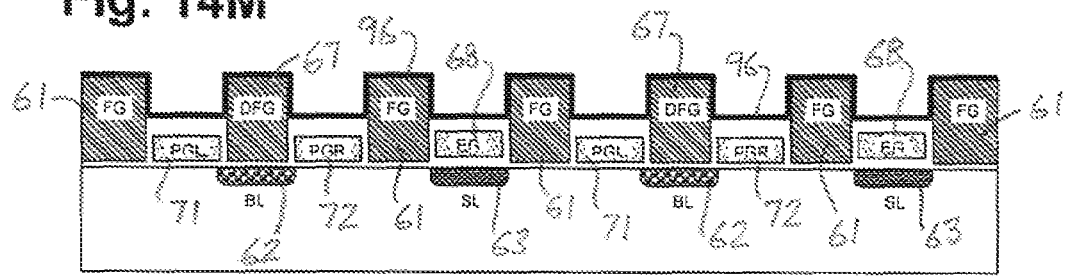

Next, another oxide layer 92 is either thermally grown or deposited over the exposed portions of the substrate and along the side walls of program gates 71, 72, erase gates 68, and the CVD layer above them, as shown in FIG. 14H. Oxide layer 92 has a thickness on the order of 100 Å on the substrate and about 100 Å to 150 Å on the side walls of the program and erase gates. The difference in thickness can be achieved either by enhanced oxidation of polysilicon or by the use of a sacrificial oxidation which is etched back by anisotropic dry etching to leave an initial layer having a thickness of about 50 Å on the side walls before layer 92 is formed.

A second conductive layer 93 of polysilicon (poly-2) is deposited over oxide layer 92, as shown in FIG. 14I. The poly-2 layer has a thickness on the order of 1000 Å to 2000 Å and is doped with phosphorus, arsenic or boron to a level on the order of $10^{20}$ to $10^{21}$ per $cm^3$. The poly-2 fills up the gaps between the CVD/poly-1 stacks and is etched back to or slightly below the top of the CVD layer to form floating gates 61 over the memory channels and dummy floating gates 67 over the bit lines, as illustrated in FIG. 14J. The portions of oxide layer 92 on the side walls of the erase gates and the program gates form oxide layers 77, 78.

The upper portion of CVD layer 88 is removed to expose the upper portions of floating gates 61 and dummy floating gates 67, as shown in FIG. 14K. The CVD oxide or nitride can be etched back by a dry anisotropic etch, leaving about 400 Å to 800 Å of the CVD material over the program gates and the erase gates.

At this point, the floating gates and dummy floating gates are in the form of long strips which extend in the same direction as the bit lines and the program gates, i.e., perpendicular to the plane of the page in FIG. 14K. In a later step, they will be etched into individual islands to form the floating gates for the individual cells.

Source line diffusions 63 are now formed in the substrate directly beneath erase gates 68 by high energy implantation of phosphorus or arsenic, using another photolithographic mask 94, as shown in FIG. 14L.

A dielectric layer 96 having a thickness on the order of 100 Å to 200 Å is then deposited on the exposed surfaces of floating gates 61, dummy floating gates 67, erase gates 68, and oxide or nitride layer 88, as shown in FIG. 14L. The dielectric material can be either a pure oxide film, a nitrided oxide film, or a combination of oxide, nitride and oxide (ONO) layers such as a layer of nitride between two layers of oxide.

Figure 14N:
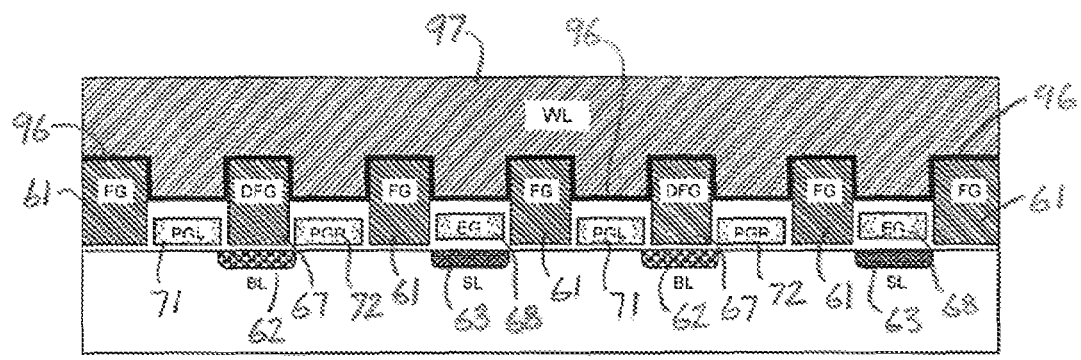

A third conductive layer 97 of polysilicon (poly-3) is then deposited over the dielectric layer, as shown in FIG. 14N. The poly-3 layer has a thickness on the order of 1000 Å to 2500 Å and is doped with phosphorus, arsenic or boron to a level on the order of $10^{20}$ to $10^{21}$ per $cm^3$. A mask (not shown) is formed over the poly-3 layer and patterned to define the word lines, and the unmasked portions of the poly-3 material, dielectric film 96, and the unprotected portions of the floating gate and dummy floating gate strips are etched by a dry anisotropic etch to form the word lines and the individual islands for the floating gates and the dummy floating gates. The CVD oxide or nitride on top of the program gates and the erase gates protects them and prevents them from being affected by the etch.

After the word lines and the floating gates are formed, channel block diffusions 81 are formed by implanting boron or $BF_2$. The implantation dose is preferably on the order of $1e^{13}$-$1e^{14}$ per $cm^3$, which is heavy enough to electrically isolate the channels between adjacent memory cells without affecting the N+ bit line and source line diffusions.

It is apparent from the foregoing that a new and improved semiconductor memory device and process of fabricating the same have been provided. While only certain presently preferred embodiments have been described in detail, as will be apparent to those familiar with the art, certain changes and modifications can be made without departing from the scope of the invention as defined by the following claims.

The invention claimed is:

1. A memory cell array, comprising: a substrate, first and second bit line diffusions in the substrate, first and second word lines adjacent to the bit line diffusions, a source line diffusion in the substrate midway between the bit line diffusions, an erase gate above the source line diffusion, first and second floating gates disposed between the word lines and the erase gate and having a height greater than the word lines and the erase gate, coupling gates overlying the floating gates and edge portions of the word lines and the erase gate, a bit line extending in a direction perpendicular to the word lines, and bit line contacts interconnecting the bit line diffusions and the bit line.

2. The memory cell array of claim 1 wherein the coupling gates are wider than the floating gates, and lower portions of the coupling gates overlap and embrace upper side portions of the floating gates to provide capacitive coupling between the coupling gates and the upper side portions of the floating gates as well as between the coupling gates and the top surfaces of the floating gates.

3. The memory cell array of claim 1 wherein a positive voltage is applied to the erase gate and a negative voltage is applied to the coupling gate of a selected cell to produce electron tunneling from the floating gate to the erase gate.

4. The memory cell array of claim 1 including a gate oxide between the erase gate and the source line diffusion of sufficient thickness that the erase gate can sustain a voltage high enough to produce electron tunneling from one of the floating gates to the erase gate without causing breakdown of the gate oxide.

5. The memory cell array of claim 4 wherein the gate oxide has a thickness on the order of 150 Å to 250 Å, and a voltage on the order of 10-15V is applied to the erase gate.

6. A memory cell array, comprising: a substrate, a plurality of bit line diffusions in the substrate, bit lines extending in a first direction above the bit line diffusions, and memory cells formed in pairs between the bit line diffusions, with each of the pairs of cells having word lines adjacent to the bit line diffusions and perpendicular to the bit lines, floating gates disposed beside and having a height greater than the word lines, at least one coupling gate capacitively coupled to the floating gates and overlying portions of the word lines, an erase gate between the floating gates, a source line diffusion in the substrate beneath the erase gate, and bit line contacts interconnecting the bit line diffusions and one of the bit lines.

7. The memory cell array of claim 6 wherein separate coupling gates are coupled to the floating gates in the two cells in each pair.

8. The memory cell array of claim 7 wherein lower portions of the coupling gates overlap and embrace upper side portions of the floating gates to provide capacitive coupling between the coupling gates and the upper side portions of the floating gates as well as between the coupling gates and the top surfaces of the floating gates.

9. The memory cell array of claim 6 wherein a single coupling gate is coupled to the floating gates in the two cells in each pair.

10. The memory cell array of claim 9 wherein the coupling gate has a central trunk and a plurality of fingers extending from the trunk and overlying the floating gates.

11. The memory cell array of claim 9 wherein lower portions of the coupling gate overlap and embrace upper portions of the floating gates to provide extended capacitive coupling between the coupling gate and the floating gates.

12. A memory cell array, comprising: a substrate; a plurality of bit line diffusions in the substrate; memory cells formed in pairs between the bit line diffusions, each of the pairs of cells having first and second conductors adjacent to the bit line diffusions, floating gates disposed beside and having a height greater than the first and second conductors, an erase gate between the floating gates, and a source line diffusion in the substrate beneath the erase gate; and at least one additional conductor overlapping and embracing upper side portions of the floating gates to provide capacitive coupling between the coupling gates and the upper side portions of the floating gates as well as between the coupling gates and the top surfaces of the floating gates.

13. The memory cell array of claim 12 wherein the at least one additional conductor includes a pair of coupling gates which extend in a direction parallel to the erase gate and are coupled to respective ones of the floating gates in the pair.

14. The memory cell array of claim 12 wherein the at least one additional conductor is a single coupling gate which extends in a direction parallel to the erase gate and is coupled to both of the floating gates in the pair.

15. The memory cell array of claim 12 wherein the at least one additional conductor is a word line which extends in a direction perpendicular to the first and second conductors and is coupled to both of the floating gates in the pair.

16. A memory cell array comprising: a substrate of a first conductivity type, first and second spaced apart regions of a second conductivity type in the substrate, first and second word lines adjacent to the first and second regions, a third region of the second conductivity type in the substrate between the first and second regions, an erase gate above the third region, first and second floating gates disposed between the word lines and the erase gate and extending to a greater height than the word lines and the erase gate, coupling gates overlying the floating gates, a bit line extending in a direction perpendicular to the word line, and bit line contacts interconnecting the first and second regions and the bit line.

17. A memory cell array, comprising: a substrate; a plurality of diffusions in the substrate; memory cells formed in pairs between the diffusions, with each of the pairs of cells having first and second conductors adjacent to the diffusions, floating gates disposed beside and extending to a greater height than the first and second conductors, an erase gate between the floating gates, and an additional diffusion in the substrate beneath the erase gate; and at least one additional conductor capacitively coupled to the floating gates.

* * * * *